(12) United States Patent
Kim et al.

(10) Patent No.: US 6,392,929 B1
(45) Date of Patent: May 21, 2002

(54) METHOD OF PROGRAMMING A FLASH MEMORY CELL

(75) Inventors: Min Kyu Kim, Seoul; Sheung Hee Park, Sungnam-Shi; Ju Yeab Lee; Tae Kyu Kim, both of Ichon-Shi, all of (KR)

(73) Assignee: Hyundai Electronics Industries Co., Ltd., Ichon-Shi (KR)

( * ) Notice: Subject to any disclaimer, the term of this patent is extended or adjusted under 35 U.S.C. 154(b) by 0 days.

(21) Appl. No.: 09/721,935

(22) Filed: Nov. 27, 2000

(30) Foreign Application Priority Data

Dec. 29, 1999 (KR) .............................. 99-65142

(51) Int. Cl.$^7$ .............................................. G11C 16/04
(52) U.S. Cl. ............................... 365/185.18; 365/185.17
(58) Field of Search ....................... 365/185.17, 185.18, 365/185.19

(56) References Cited

U.S. PATENT DOCUMENTS 5,943,260 A * 8/1999 Hirakawa ............... 365/185.03
6,014,330 A * 1/2000 Endoh et al. ........... 365/185.17

* cited by examiner

*Primary Examiner*—Vu A. Le
(74) *Attorney, Agent, or Firm*—Finnegan, Henderson, Farabow, Garrett & Dunner, L.L.P.

(57) ABSTRACT

There is disclosed a method of programming a flash memory cell, which is performed applying a given voltage a gate and a drain and maintaining a source and a substrate at a ground potential. The method variably applies a given voltage, with two or more steps, to one of the gate and drain terminals while applying a given voltage to the other of the gate and drain terminals, thus reducing the programming current per cell. Accordingly, the present invention can improve reliability and throughput of the flash memory cell.

4 Claims, 4 Drawing Sheets

METHOD OF PROGRAMMING A FLASH MEMORY CELL

BACKGROUND OF THE INVENTION

1. Field of the Invention

The invention relates Generally to a method of programming a flash memory cell, and more particularly to, a method, of programming a flash memory cell which can significantly reduce a programming current per cell to thus improve reliability and throughput of a device, in such a manner that one voltage of the voltages applied to a gate terminal and a drain terminal, which are applied when a flash memory device is programmed, is maintained at a given voltage level, while adjusting the other voltage of the voltages applied to the gate and the drain, by more than two steps.

2. Description of the Prior Art

As can be seen from FIG. 1, in a general stack gate-type flash memory cell, a tunnel oxide film 12 is formed at a selected region on a semiconductor substrate 11, and a floating gate 13, a dielectric film 14 and a control gate 15 are stacked thereon. Also, a source 16 and a drain 17 are formed at a given region on the semiconductor substrate 11.

In order to program the above-mentioned flash memory cell, electrons must be injected into the floating gate by hot carrier injection method. For this, a high voltage must be applied to the control gate, in order to apply a voltage more than a given threshold voltage to the drain and induce thus generated electrons into the floating gate. On the other hand, the source and the substrate must be maintained at a ground potential.

However, as the cell size is reduced, the length of channel is shortened and the channel current is also rapidly increased when the programming operation is performed. Thus, it is very difficult to design the drain pump circuit that keeps the drain voltage at an appropriate value. In other words, the size of the transistor within the pump circuit must be greater and the degree of control in the process becomes degraded.

FIG. 2 shows a waveform of the voltages applied to the gate and drain terminals upon programming of the conventional flash memory cell. As shown, if a high voltage (about 9V) is applied to the gate from the beginning for performing the programming, as shown in FIG. 2, the drain voltage will not withstand the programming peak current because it will become greater, as shown in FIG. 3. Therefore, the drain voltage will be reduced, as shown in FIG. 4. Thus, the programming time will be extended unlimitedly, resulting in failure of the programming. Also, this causes a serious problem at the present time when a flash memory cell for use in a low voltage is widely used.

SUMMARY OF THE INVENTION

It is therefore an object of the present invention to provide a method of programming a flash memory cell capable of reducing a programming current per cell, thus improving reliability and throughput of a device.

In order to accomplish the above object, a method of programming a flash memory cell according to the present invention, which is performed applying a given voltage a gate and a drain and maintaining a source and a substrate at a ground potential is characterized in that it variably applies a given voltage, with two or more steps, to one of the gate and drain terminals while applying a given voltage to the other of the gate and drain terminals.

BRIEF DESCRIPTION OF THE DRAWINGS

The aforementioned aspects and other features of the present invention will be explained in the following description, taken in conjunction with the accompanying drawings, wherein.

DETAILED DESCRIPTION OF PREFERRED EMBODIMENTS

Figure 1:
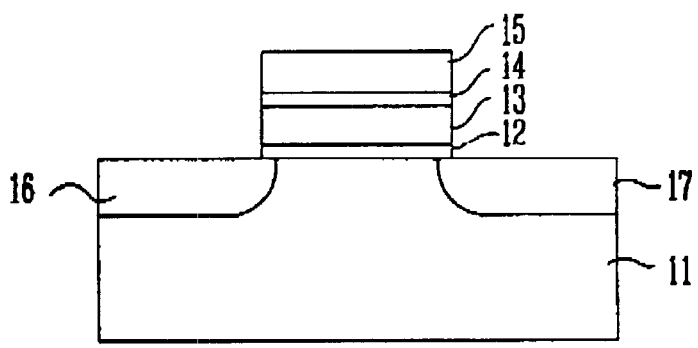
FIG. 1 is a cross-sectional view of a general stack gate-type flash memory cell.
Figure 2:
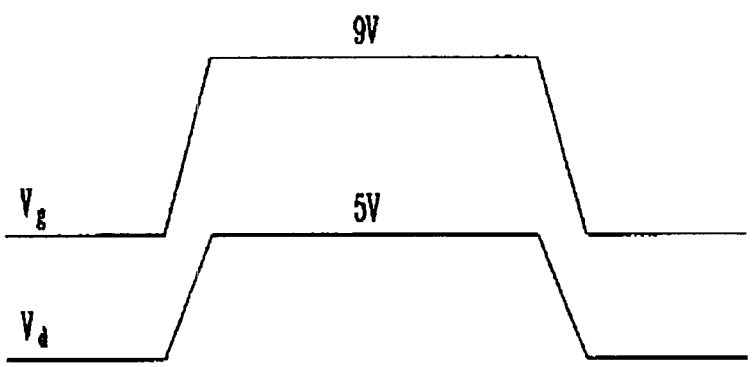
FIG. 2 shows a waveform of the voltage applied to the gate and drain terminals upon programming of the conventional flash memory cell.
Figure 3:
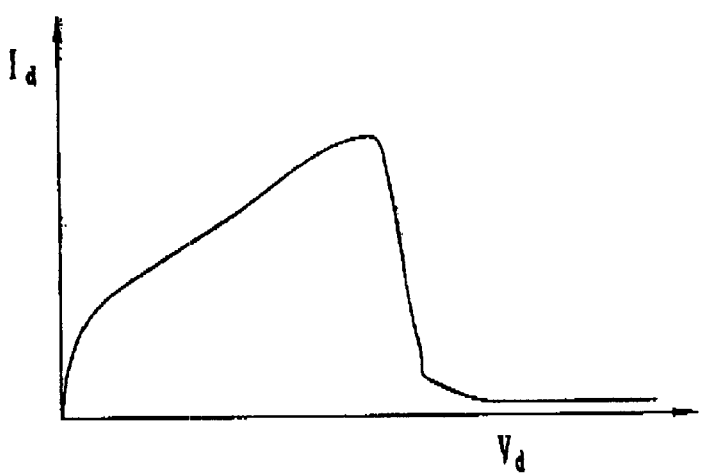
FIG. 3 is a characteristic graph of the drain current depending on the drain voltage upon programming of the conventional flash memory cell.
Figure 4:
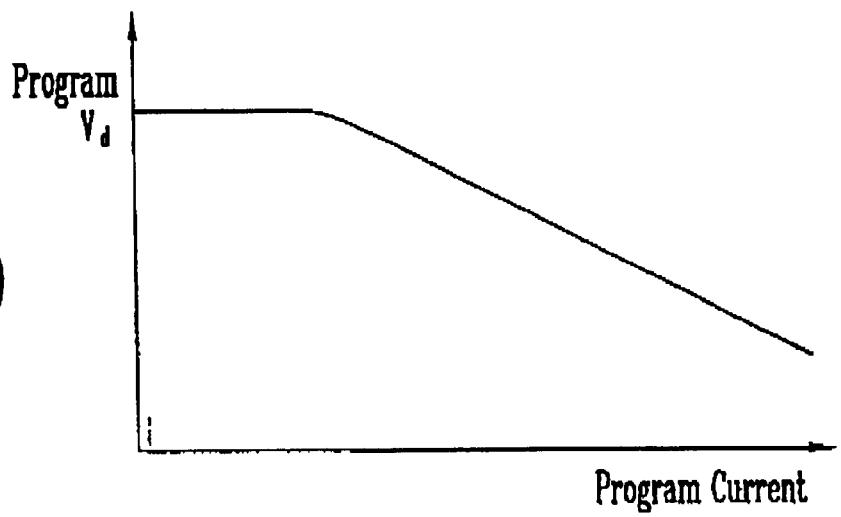
FIG. 4 is a characteristic graph of the drain voltage depending on the drain current upon programming of the conventional flash memory cell.

The present invention will be described in detail by way of a preferred embodiment with reference to accompanying drawings, in which like reference numerals are used to identify the same or similar parts.

Figure 5:
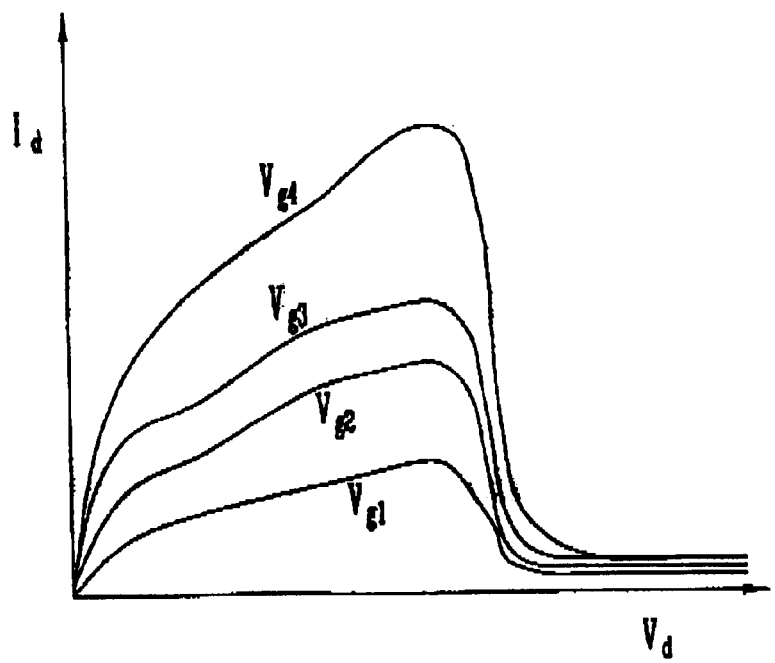
FIG. 5 is a varying graph of a programming current depending on the gate voltage, for explaining the principle of a method of programming a flash memory cell according to the present invention.

FIG. 5 is a varying graph of a programming current depending on the gate voltage. Using this, the principle of the present invention will be explained as follow: That is, when the flash memory cell is programmed, if the gate voltage is low, the programming peak current is reduced. Thus, when programming the cell, the voltage applied to the gate and the drain is varied to adjust the programming threshold voltage, thus reducing the current of the cell.

Figure 6:
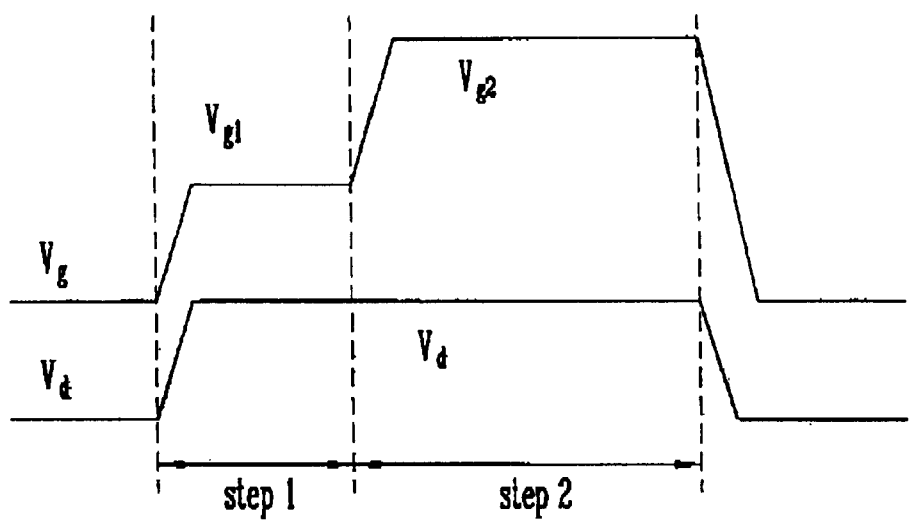
FIG. 6 shows a waveform of the voltage applied to the gate and the drain, for programming the flash memory cell according to the present invention.

FIG. 6 shows a waveform of the voltage applied to the gate and the drain, for programming the flash memory cell according to the present invention. If the voltage to be applied to the gate is applied with two or more steps so that a firstly applied voltage is controlled to be lower than a secondly applied voltage and while applying the drain voltage, consumption of the current will be great from the beginning. Thus, the cause of failure in the programming can be prevented since the drain voltage will become lower than the threshold voltage. In other words, the programming is performed by applying a voltage of 3~7V to the gate, in the first step of the programming during about 2 μs, and increasing the gate voltage to 8~10V, in the second step of the programming. At this time, the drain voltage must be applied with a voltage of 4~5V during the first and second programming steps. Of course, the source and the substrate must be kept at a ground potential.

Figure 7:
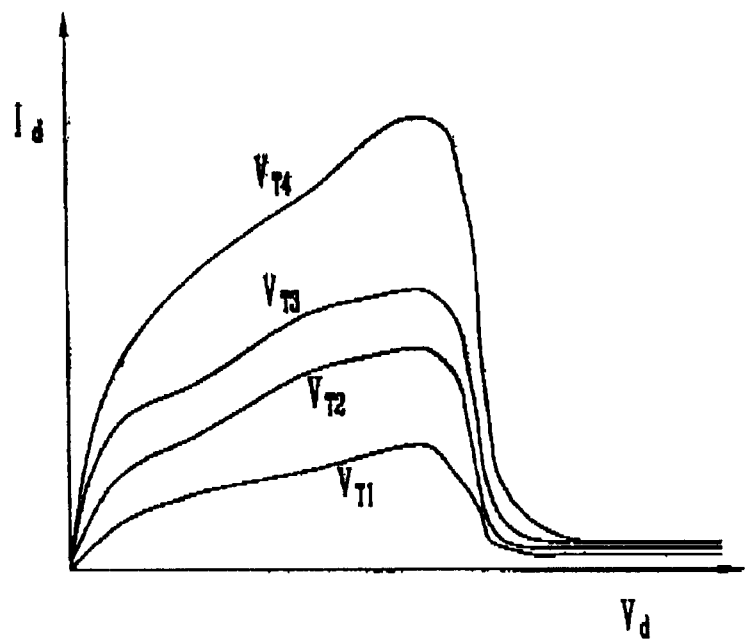
FIG. 7 is a varying graph of the programming current according to the threshold voltage.

Thus, if the programming voltage is lowered, the programming can smoothly proceeds while maintaining the drain voltage properly. Then, when the programming proceeds to a certain extent in the first step, the programming current will be significantly reduced by the phenomenon shown in FIG. 7, despite of the high gate voltage in the second step.

Therefore, the value of the threshold voltage after the programming can be safely obtained while keeping the amount of the current consumed upon programming at a small value. This is because the gate voltage seems to be lowered because the threshold voltage becomes higher by the gate voltage since the drain voltage is properly formed in the first step and the threshold voltage becomes higher in the second programming step.

Figure 8:
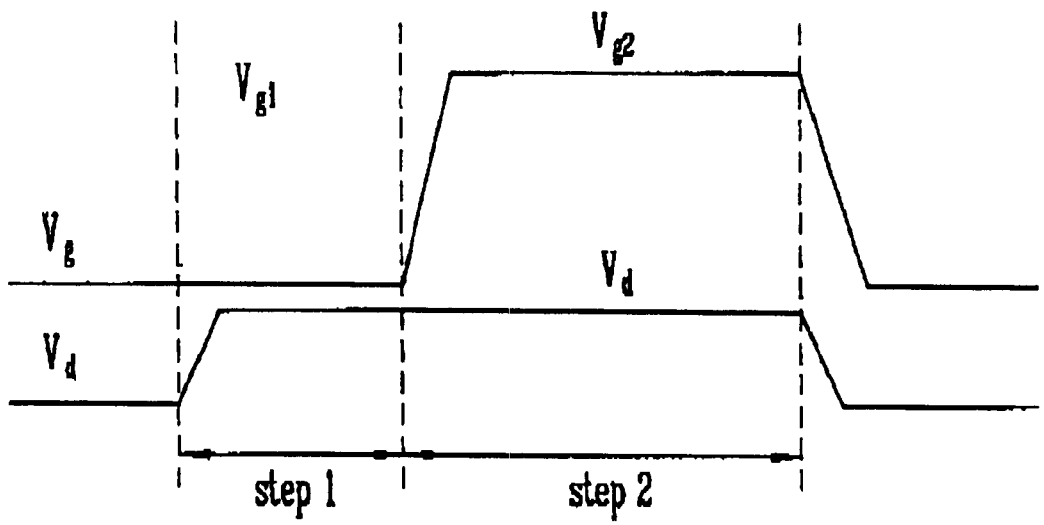
FIG. 8 shows a voltage waveform applied to the gate and the drain, for programming the flash memory cell according to another embodiment of the present invention.

FIG. 8 shows a voltage waveform applied to the gate and the drain, for programming the flash memory cell according to another embodiment of the present invention. The programming is performed by applying a voltage of 0V to the gate in the first step of the programming during about 2 $\mu$s while applying the drain voltage of 4~5V, and then increasing the gate voltage to 8~10V in the second step of the programming. Similarly, the source and the substrate must be kept at a ground potential.

Figure 9:
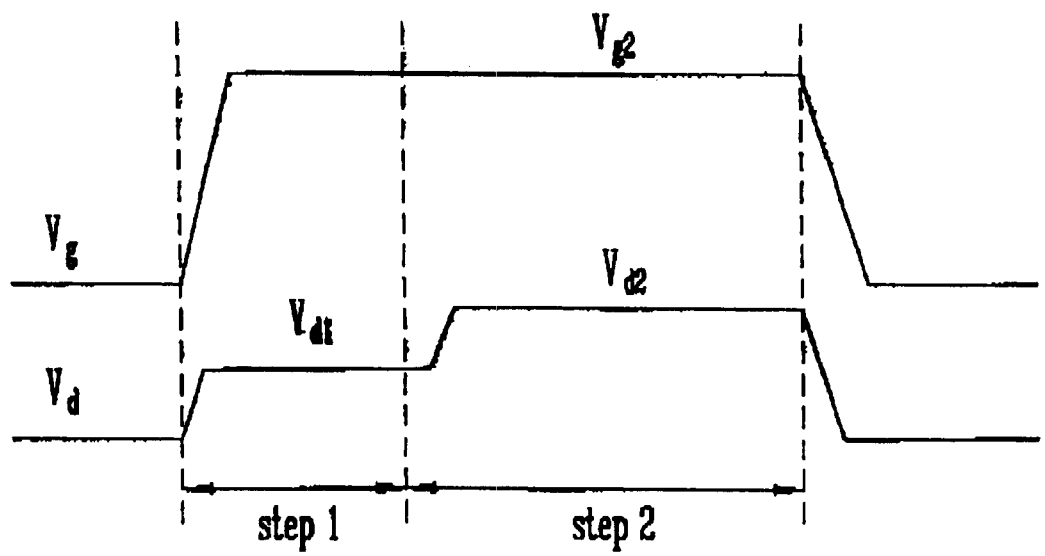
FIG. 9 shows a voltage waveform applied to the gate and the drain, for programming the flash memory cell according to still another embodiment of the present invention.

FIG. 9 shows a voltage waveform applied to the gate and the drain, for programming the flash memory cell according to still another embodiment of the present invention. The programming is performed by applying a voltage of 3~4V to the drain in the first step of the programming during about 2 $\mu$s while maintaining the gate voltage at 8~10V, and then increasing the drain voltage to 4~5V in the second step of the programming. Similarly, the source and the substrate must be kept at a ground potential.

As can be understood from the above description, the present invention can reduce the programming current generated upon programming, resulting in a reduced load on the drain pump design circuit necessary for the programming. Therefore, it makes it possible to manufacture a cell having further smaller channel length when same pump circuits are used, thus reducing the size of the cell. As a result, the present invention can improve reliability of the device.

The present invention has been described with reference to a particular embodiment in connection with a particular application. Those having ordinary skill in the art and access to the teachings of the present invention will recognize additional modifications and applications within the scope thereof.

It is therefore intended by the appended claims to cover any and all such applications, modifications, and embodiments within the scope of the present invention.

What is claimed is:

1. A method of programming a flash memory cell, which is performed by a given voltage to a gate terminal and a drain terminal and maintaining a source and a substrate at a ground potential, comprising the steps of:

variably applying a given voltage, with two or more steps, to one of the gate and drain terminals while applying a given voltage to the other of the gate and drain terminals, wherein a period of applying the given voltage, with two or more steps, to one of the gate and drain terminals is identical to the period of applying a given voltage to the other of the gate and drain terminals.

2. The method of programming a flash memory cell according to claim 1, wherein the method is performed by applying a first voltage to the gate terminal while applying a second voltage to the drain terminal, and after a given time, applying a third voltage to the gate terminal, wherein the period of applying the first and third voltage to the gate terminal is identical to the period of applying the second voltage to the drain terminal.

3. The method of programming a flash memory cell according to claim 1, wherein the method is performed by applying a zero voltage to the gate terminal while applying a second voltage to the drain terminal, and after a given time, applying a third voltage to the gate terminal, wherein the period of applying the first and third voltage to the gate terminal is identical to the period of applying the second voltage to the drain terminal.

4. The method of programming a flash memory cell according to claim 1, wherein the method is performed by applying a first voltage to the drain terminal while applying a second voltage to the gate terminal, and after a given time, applying a third voltage to the drain terminal, wherein the period of applying the first and third voltage to the drain terminal is identical to the period of applying the second voltage to the gate terminal.

* * * * *